(12) United States Patent
Velichko et al.

(10) Patent No.: US 10,014,333 B2
(45) Date of Patent: Jul. 3, 2018

(54) BACK-SIDE ILLUMINATED PIXELS WITH INTERCONNECT LAYERS

(71) Applicant: SEMICONDUCTOR COMPONENTS INDUSTRIES, LLC, Phoenix, AZ (US)

(72) Inventors: Sergey Velichko, Boise, ID (US); Christopher Silsby, Albany, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 122 days.

(21) Appl. No.: 14/836,599

(22) Filed: Aug. 26, 2015

(65) Prior Publication Data

US 2017/0062501 A1 Mar. 2, 2017

(51) Int. Cl.
*H01L 27/146* (2006.01)
*H01L 27/148* (2006.01)

(52) U.S. Cl.
CPC .... *H01L 27/14612* (2013.01); *H01L 27/1464* (2013.01); *H01L 27/1469* (2013.01); *H01L 27/14629* (2013.01); *H01L 27/14632* (2013.01); *H01L 27/14634* (2013.01); *H01L 27/14636* (2013.01); *H01L 27/14641* (2013.01); *H01L 27/14643* (2013.01)

(58) Field of Classification Search
CPC ............ H01L 27/146–27/1464; H01L 27/14609–27/14614; H01L 27/14621; H01L 27/14627; H01L 27/1463; H01L 27/14636

See application file for complete search history.

(56) References Cited

U.S. PATENT DOCUMENTS

| | | | | |
|---|---|---|---|---|
| 5,705,807 A * | 1/1998 | Throngnumchai | ... | G01J 1/4228 250/214 B |
| 6,657,665 B1 * | 12/2003 | Guidash | ............ | H01L 27/14603 257/E27.131 |
| 7,960,768 B2 * | 6/2011 | Dungan | ............ | H01L 27/14634 257/291 |
| 8,049,256 B2 * | 11/2011 | Guidash | ............ | H01L 27/14634 257/292 |
| 8,071,429 B1 * | 12/2011 | Qian | ....................... | H01L 21/78 257/E21.238 |

(Continued)

FOREIGN PATENT DOCUMENTS

WO 2012042782 A1 4/2012

*Primary Examiner* — Maliheh Malek
(74) *Attorney, Agent, or Firm* — Treyz Law Group, P.C.; Joseph F. Guihan

(57) ABSTRACT

An imaging pixel may be provided with an upper substrate layer, a lower substrate layer, a floating diffusion region in the upper substrate layer, and a photodiode in the upper substrate layer that is coupled to the floating diffusion region. The imaging pixel may also include a source follower transistor in the lower substrate layer and an interconnect layer in between the upper substrate layer and the lower substrate layer. The interconnect layer may couple the floating diffusion region directly to the source follower transistor. The imaging pixel may include a reset transistor in the upper substrate layer. The imaging pixel may include a metal layer in the lower substrate layer, a transfer transistor in the upper substrate layer, and an interconnect layer that couples the transfer transistor to the metal layer.

19 Claims, 8 Drawing Sheets

(56) References Cited

U.S. PATENT DOCUMENTS

| | | | |
|---|---|---|---|
| 8,368,157 B2 | 2/2013 | Lenchenkov | |
| 8,530,812 B2 * | 9/2013 | Kikuchi | H01L 27/14625 250/208.1 |
| 8,670,059 B2 * | 3/2014 | Ikeda | H01L 27/14609 250/206 |
| 8,730,330 B2 * | 5/2014 | Solhusvik | H04N 5/335 348/187 |
| 8,835,981 B2 * | 9/2014 | Oishi | H04N 5/369 257/184 |
| 8,890,047 B2 | 11/2014 | Solhusvik et al. | |
| 9,007,489 B2 * | 4/2015 | Wan | H04N 5/272 348/239 |
| 9,013,612 B2 * | 4/2015 | Del Monte | H01L 27/14629 348/272 |
| 9,030,583 B2 * | 5/2015 | Gove | H04N 5/347 348/207.1 |
| 9,053,993 B2 * | 6/2015 | Yan | H04N 5/345 |
| 9,161,028 B2 * | 10/2015 | Solhusvik | H04N 5/335 |
| 9,319,612 B2 * | 4/2016 | Yan | H04N 5/378 |
| 9,337,232 B2 * | 5/2016 | Lee | H01L 27/14634 |
| 9,478,574 B2 * | 10/2016 | Lenchenkov | H01L 27/14627 |
| 9,508,775 B2 * | 11/2016 | Kobayashi | H01L 27/14632 |
| 9,515,116 B1 * | 12/2016 | Sze | H01L 27/1464 |
| 9,584,744 B2 * | 2/2017 | Lenchenkov | H04N 5/359 |
| 9,635,290 B2 * | 4/2017 | Okura | H04N 5/363 |
| 9,654,712 B2 * | 5/2017 | Hong | H04N 5/374 |
| 9,711,551 B2 * | 7/2017 | Silsby | H01L 27/14621 |
| 9,749,553 B2 * | 8/2017 | Borthakur | H04N 5/332 |
| 9,773,828 B2 * | 9/2017 | Wang | H01L 27/14621 |
| 9,854,184 B2 * | 12/2017 | Velichko | H04N 5/353 |
| 2003/0042500 A1 * | 3/2003 | Rhodes | H01L 27/14609 257/185 |
| 2004/0141077 A1 * | 7/2004 | Ohkawa | H01L 27/14603 348/308 |
| 2005/0035381 A1 * | 2/2005 | Holm | H01L 27/1463 257/290 |
| 2006/0043440 A1 * | 3/2006 | Hiyama | H01L 27/14603 257/291 |
| 2006/0132633 A1 * | 6/2006 | Nam | H01L 27/14603 348/308 |
| 2006/0279649 A1 * | 12/2006 | Cole | H01L 27/14621 348/308 |
| 2008/0073488 A1 * | 3/2008 | Silsby | H04N 3/155 250/208.1 |
| 2008/0116537 A1 * | 5/2008 | Adkisson | H01L 27/14618 257/448 |
| 2008/0124930 A1 * | 5/2008 | Lim | C09G 1/02 438/692 |
| 2009/0159944 A1 * | 6/2009 | Oh | H01L 27/14609 257/292 |
| 2009/0184349 A1 * | 7/2009 | Dungan | H01L 27/14634 257/292 |
| 2009/0200589 A1 * | 8/2009 | Qian | H01L 27/14603 257/292 |
| 2009/0201400 A1 * | 8/2009 | Zhang | H01L 27/14609 348/296 |
| 2009/0242950 A1 | 10/2009 | McCarten et al. | |
| 2009/0294812 A1 * | 12/2009 | Gambino | H01L 27/14647 257/292 |
| 2009/0294813 A1 * | 12/2009 | Gambino | H01L 27/14632 257/292 |
| 2010/0060764 A1 * | 3/2010 | McCarten | H01L 27/14634 348/308 |
| 2010/0148290 A1 | 6/2010 | Park | |
| 2010/0171191 A1 | 7/2010 | Lee | |
| 2011/0037137 A1 * | 2/2011 | Wehbe-Alause | H01L 27/14623 257/434 |
| 2011/0096215 A1 * | 4/2011 | Choi | H01L 27/14632 348/294 |
| 2011/0157445 A1 * | 6/2011 | Itonaga | H01L 21/76898 348/308 |
| 2011/0207258 A1 * | 8/2011 | Ahn | H01L 21/6835 438/70 |
| 2011/0226934 A1 * | 9/2011 | Tian | H01L 27/14603 250/208.1 |
| 2011/0260221 A1 * | 10/2011 | Mao | H01L 27/14698 257/291 |
| 2012/0002092 A1 | 1/2012 | Guidash | |
| 2012/0019699 A1 * | 1/2012 | Masuda | H04N 5/363 348/308 |
| 2012/0104465 A1 * | 5/2012 | Kim | H01L 27/14603 257/225 |
| 2012/0205730 A1 * | 8/2012 | Chen | H01L 27/14609 257/292 |
| 2012/0326008 A1 * | 12/2012 | McKee | H04N 5/37452 250/208.1 |
| 2013/0001725 A1 * | 1/2013 | Huang | H01L 21/6835 257/432 |
| 2013/0027565 A1 * | 1/2013 | Solhusvik | H04N 5/335 348/187 |
| 2013/0075607 A1 * | 3/2013 | Bikumandla | H01L 27/14632 250/332 |
| 2013/0082313 A1 * | 4/2013 | Manabe | H01L 27/14603 257/292 |
| 2013/0084660 A1 * | 4/2013 | Lu | H01L 31/1864 438/14 |
| 2013/0113065 A1 * | 5/2013 | Qian | H01L 27/14636 257/437 |
| 2013/0161487 A1 | 6/2013 | Sakaguchi et al. | |
| 2013/0193541 A1 * | 8/2013 | Sun | H01L 31/103 257/432 |
| 2013/0221194 A1 * | 8/2013 | Manabe | H01L 27/14612 250/208.1 |
| 2013/0234029 A1 * | 9/2013 | Bikumandla | H01L 25/043 250/349 |
| 2013/0285181 A1 * | 10/2013 | Lin | H01L 27/1463 257/432 |
| 2013/0307040 A1 * | 11/2013 | Ahn | H01L 27/1463 257/292 |
| 2014/0042298 A1 | 2/2014 | Wan et al. | |
| 2014/0077323 A1 * | 3/2014 | Velichko | H01L 27/14627 257/432 |
| 2014/0078359 A1 * | 3/2014 | Lenchenkov | H01L 27/14627 348/294 |
| 2014/0111663 A1 * | 4/2014 | Soda | H01L 27/1464 348/222.1 |
| 2014/0117481 A1 | 5/2014 | Kato et al. | |
| 2014/0191357 A1 * | 7/2014 | Lee | H04N 5/37457 257/443 |
| 2014/0231887 A1 * | 8/2014 | Chen | H01L 31/18 257/291 |
| 2014/0246782 A1 * | 9/2014 | Kim | H01L 23/544 257/774 |
| 2014/0264298 A1 * | 9/2014 | Park | H01L 51/44 257/40 |
| 2014/0299925 A1 * | 10/2014 | Manabe | H01L 27/14603 257/292 |
| 2014/0327061 A1 * | 11/2014 | Lee | H01L 27/14634 257/292 |
| 2015/0009376 A1 * | 1/2015 | Tsunai | H01L 27/14634 348/300 |
| 2015/0009379 A1 * | 1/2015 | Yan | H04N 5/3559 348/302 |
| 2015/0035028 A1 * | 2/2015 | Fan | H01L 27/14623 257/292 |
| 2015/0062392 A1 * | 3/2015 | Lenchenkov | H01L 31/02164 348/294 |
| 2015/0076643 A1 * | 3/2015 | Kikuchi | H01L 27/14621 257/432 |
| 2015/0076648 A1 * | 3/2015 | Yang | H01L 27/1463 257/446 |
| 2015/0122971 A1 | 5/2015 | He | |
| 2015/0123173 A1 | 5/2015 | He | |
| 2015/0340394 A1 * | 11/2015 | Hirase | H01L 27/14609 257/292 |
| 2015/0349005 A1 * | 12/2015 | Yamashita | H01L 27/14605 257/292 |

(56) References Cited

U.S. PATENT DOCUMENTS

| | | | | |
|---|---|---|---|---|
| 2015/0349014 A1* | 12/2015 | Kobayashi | H01L 27/14632 | 257/444 |
| 2015/0357360 A1* | 12/2015 | Tian | H01L 27/14605 | 250/208.2 |
| 2015/0372030 A1* | 12/2015 | Cheng | H01L 27/1462 | 257/432 |
| 2015/0373255 A1* | 12/2015 | Kim | H01L 27/14607 | 348/349 |
| 2016/0020235 A1* | 1/2016 | Yamashita | H01L 27/14609 | 250/208.1 |
| 2016/0020239 A1* | 1/2016 | Liu | H01L 27/14634 | 257/292 |
| 2016/0043120 A1* | 2/2016 | Ahn | H01L 27/1463 | 257/229 |
| 2016/0088249 A1* | 3/2016 | Funaki | H04N 5/378 | 348/296 |
| 2016/0141325 A1* | 5/2016 | Kao | H01L 27/14601 | 257/292 |
| 2016/0172412 A1* | 6/2016 | Lee | H01L 27/14607 | 257/432 |
| 2016/0204143 A1* | 7/2016 | Lee | H01L 27/1463 | 257/229 |
| 2016/0268220 A1* | 9/2016 | Tsai | H01L 27/14643 | |
| 2016/0276380 A1* | 9/2016 | Yang | H01L 27/14629 | |
| 2016/0316163 A1* | 10/2016 | Beck | H04N 5/3559 | |
| 2016/0329365 A1* | 11/2016 | Tekleab | H01L 27/1463 | |
| 2016/0343751 A1* | 11/2016 | Sze | H01L 27/1464 | |
| 2016/0343761 A1* | 11/2016 | Ishino | H01L 27/1462 | |
| 2016/0345005 A1* | 11/2016 | Hoekstra | H04N 5/3592 | |
| 2016/0379960 A1* | 12/2016 | Huang | H01L 25/0657 | 257/432 |
| 2016/0381310 A1* | 12/2016 | Lenchenkov | H04N 5/359 | 348/302 |
| 2017/0012071 A1* | 1/2017 | Lenchenkov | H01L 27/14627 | |
| 2017/0053955 A1* | 2/2017 | Sze | H01L 27/1464 | |
| 2017/0104020 A1* | 4/2017 | Lee | H01L 27/1463 | |
| 2017/0133429 A1* | 5/2017 | Cheng | H01L 27/14685 | |
| 2017/0186805 A1* | 6/2017 | Lee | H01L 27/14645 | |
| 2017/0221954 A1* | 8/2017 | Madurawe | H01L 27/14636 | |
| 2018/0070031 A1* | 3/2018 | Velichko | H01L 27/14636 | |

* cited by examiner

BACK-SIDE ILLUMINATED PIXELS WITH INTERCONNECT LAYERS

BACKGROUND

This relates generally to imaging systems and, more particularly, to imaging systems with back side illuminated pixels.

Modern electronic devices such as cellular telephones, cameras, and computers often use digital image sensors. Imager sensors (sometimes referred to as imagers) may be formed from a two-dimensional array of image sensing pixels. Each pixel includes a photosensitive layer that receives incident photons (light) and converts the photons into electrical signals. Image sensors are sometimes designed to provide images to electronic devices using a Joint Photographic Experts Group (JPEG) format.

Pixels may be front-side illuminated or back-side illuminated. In back-side illuminated pixels, processing circuitry may be formed underneath the photosensitive layer so that processing circuitry does not prevent incident light from reaching the photosensitive layer. However, certain back-side illuminated pixels may have a low conversion gain, which may be defined as the change in voltage for each unit of charge accumulated by a photodiode. Pixels with low conversion gain may have excess pixel readout noise and poor pixel performance.

It would therefore be desirable to be able to provide improved back-side illuminated pixels for image sensors.

DETAILED DESCRIPTION

Figure 1:
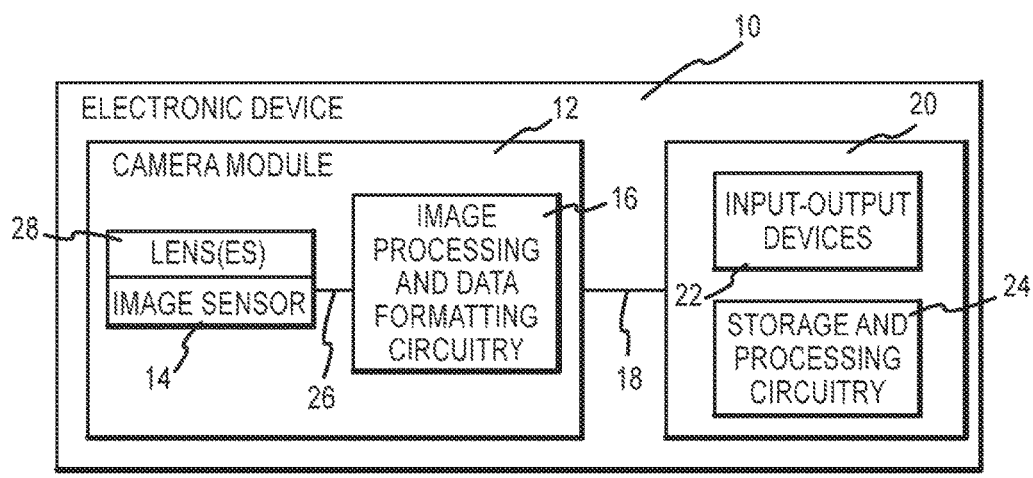
FIG. 1 is a schematic diagram of an illustrative electronic device with an image sensor in accordance with an embodiment of the present invention.

Embodiments of the present invention relate to image sensors with pixels that have interconnect layers. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
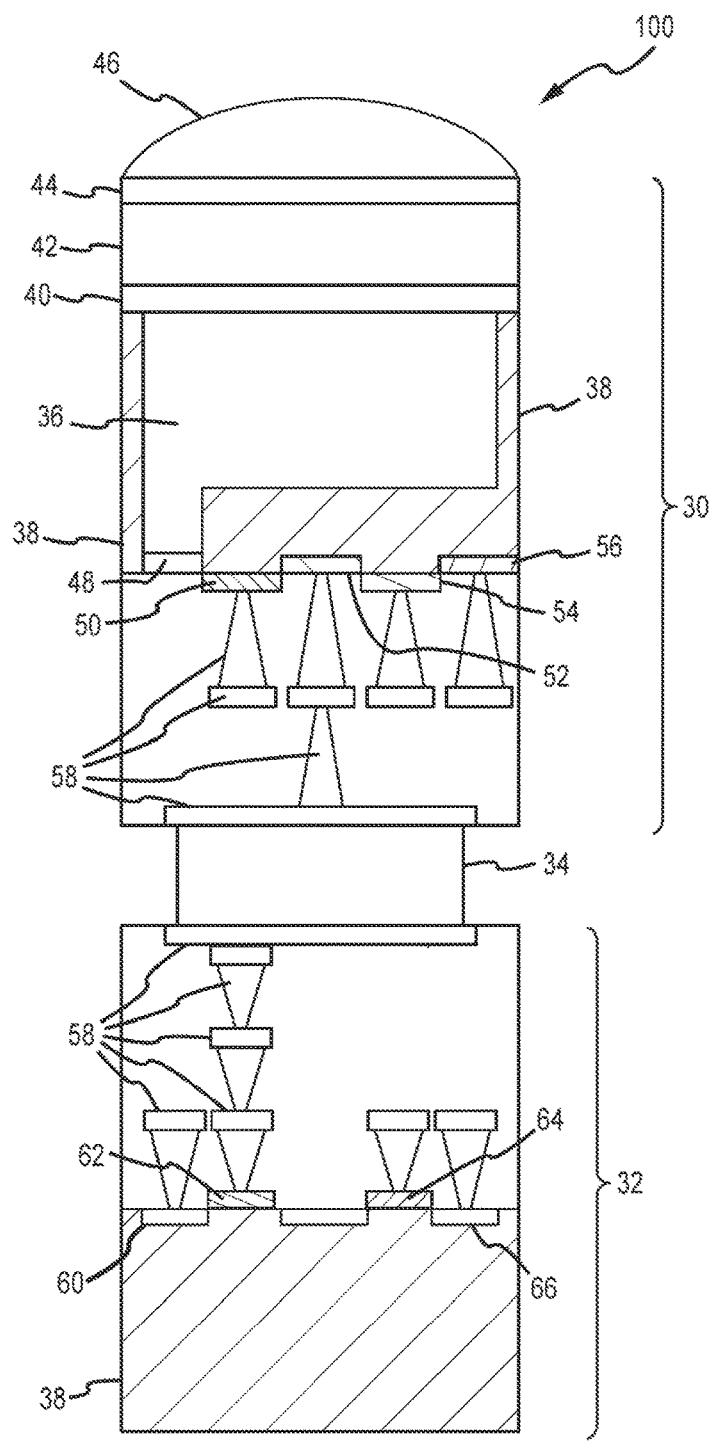
FIG. 2 is a cross-sectional side view of an illustrative pixel with an interconnect layer in accordance with an embodiment of the present invention.

An illustrative image pixel of image sensor 14 is shown in FIG. 2. Pixel 100 may include two substrate layers. The substrate layers may be wafers, which are layers of semiconductor material such as silicon. An upper substrate layer 30 may be connected to a lower substrate layer 32. Upper and lower substrate layers 30 and 32 may be crystalline silicon or any other desired material. An interconnect layer may be used to connect upper substrate layer 30 to lower substrate layer 32. Interconnect layer 34 may be formed from a conductive material such as metal. In certain embodiments, the interconnect layer may include solder. The interconnect layer may also be a through silicon via (TSV).

Pixel 100 may have include photosensitive layer 36 in upper substrate layer 30. Photosensitive layer may be a photodiode formed from n-type doped silicon. The photosensitive layer may be surrounded by isolation layer 38. Isolation layer 38 may be formed from p-type doped silicon. In certain embodiments, the photodiode may be formed from p-type doped silicon and the isolation layer may be formed from n-type doped silicon. In yet another embodiment, isolation layer 38 may be formed using deep trench isolation (DTI) or a combination of deep trench isolation and doped silicon. Isolation layer 38 may prevent charge from leaking to adjacent photosensitive layers.

Photosensitive layer 36 may be covered by passivation layer 40, color filter layer 42, planarization layer 44, and microlens 46. Passivation layer 40 and planarization layer 44 may be formed from dielectric materials. Color filter layer 42 may be a part of a larger color filter array. For example, each pixel in image sensor 14 may have an individual color filter layer that is part of the color filter array. Image sensor 14 may include a Bayer color filter array in which vertically and horizontally adjacent color filters in the array are of different colors. The Bayer color filter array includes red, green, and blue color filters. A single red, green, blue, cyan, magenta, yellow, near-infrared, infrared, or clear color filter may be formed over photosensitive layer 36. In certain embodiments, the color filter formed over photosensitive layer 36 may have areas that pass colored light and areas that are clear (i.e., that pass visible spectrum light). A microlens may be formed over each pixel in image sensor 14. Each microlens may direct light towards a respective photosensitive layer.

Photosensitive layer 36 may include pinning layer 48. Pinning layer 48 may be adjacent to transfer transistor 50 (TX), floating diffusion region 52 (FD), reset transistor 54 (RST), and bias voltage supply line 56 (Vaa). Conductive layers 58 may be positioned in both the upper and lower substrate layers (for simplicity of the drawing every metal layer is not explicitly labeled). The conductive layers may be formed from metal. Conductive layers 58 may include a number of vias and traces that are electrically connected to other conductive layers, interconnect layer 34, or other components in pixel 100.

Lower substrate 32 may include bias voltage supply line 60 (Vaa), source follower transistor 62 (SF), row select transistor (RS) and pixel output line 66 (Pixout). An additional isolation layer 38 may be formed in lower substrate layer 32. Metal layers 58 may couple floating diffusion region 52 to interconnect layer 34. The interconnect layer may then be coupled to source follower transistor 62. In this way, floating diffusion region 52 is coupled directly to source follower transistor 62 via a conductive interconnect path. Interconnect layer 34 may be coupled to only floating diffusion region 52 and source follower transistor 62. Interconnect layer 34 may not be coupled to any additional transistors or regions.

Reset transistor 54 and floating diffusion region 52 may both be formed in upper substrate layer 30, as shown in FIG. 2. In an alternate embodiment, reset transistor 54 may be formed in the lower substrate layer while floating diffusion region 52 may be formed in the upper substrate layer. However, in this embodiment the floating diffusion may experience a higher capacitance. This affects conversion gain, which may be defined as the change in voltage for each unit of charge accumulated by a photodiode. The conversion gain may be inversely proportional to the effective capacitance at floating diffusion region 52. For example, a large effective capacitance may result in a low conversion gain, whereas a small effective capacitance may result in a high conversion gain. Higher conversion gain may result in improved pixel response and less pixel readout noise. Therefore, it may be desirable for the effective capacitance of the floating diffusion region to be low to ensure high conversion gain. The arrangement of FIG. 2, in which reset transistor 54 is formed in upper substrate layer 30, may result in low effective capacitance of the floating diffusion region which results in better pixel performance.

Another advantage of interconnect layer 34 is that it may act as a reflector for photodiode 36. As photons pass through photodiode 36, some of the photons may be absorbed by the photodiode and converted to charge. However, some photons may pass through the photodiode without being converted to charge. These photons may reflect off of interconnect layer 34 and travel upwards towards the photodiode. This increases the probability that the photon will be converted to charge by the photodiode.

Figure 3:
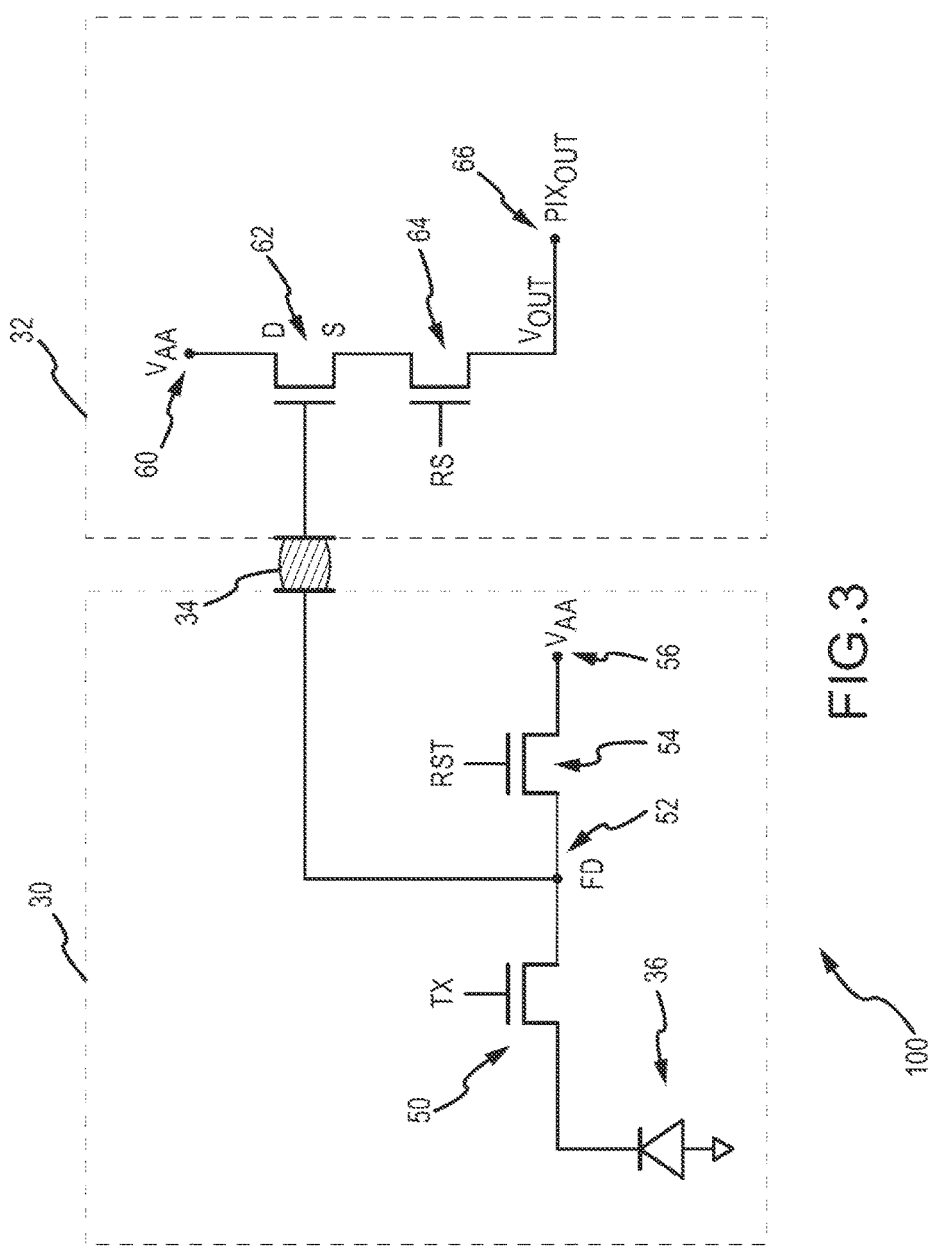
FIG. 3 is a diagram of the illustrative pixel of FIG. 2 in accordance with an embodiment of the present invention.

FIG. 3 shows circuitry of the illustrative pixel shown in FIG. 2. Before the transfer of charge accumulated in photodiode 36 to floating diffusion region 52, reset transistor 54 may be turned on to reset the charge at floating diffusion region 52 to bias voltage Vaa. The reset transistor may then be turned off. Once the reset transistor is turned off, the transfer transistor 50 may then be turned on to transfer charge accumulated in photodiode 36 to floating diffusion region 52. The transfer transistor may be turned off after the transfer of charge is complete.

Floating diffusion region 52 may be implemented using a region of doped semiconductor (e.g., a doped silicon region formed in a silicon substrate by ion implantation, impurity diffusion, or other doping techniques). The doped semiconductor region (i.e., the floating diffusion region) exhibits a capacitance that can be used to store the charge that has been transferred from photodiode 36. The signal associated with the stored charge on floating diffusion region 52 is conveyed to row select transistor 64 by source-follower transistor 62.

When it is desired to read out the value of the stored charge (i.e., the value of the stored charge that is represented by the signal at the source S of transistor 62), row select transistor 64 may be turned on. When row select transistor 64 is turned on, a corresponding signal $V_{OUT}$ that is representative of the magnitude of the charge on floating diffusion region 52 is produced on output path 66 (Pixout). In a typical configuration, there are numerous rows and columns of pixels such as pixel 100 in the image sensor pixel array of a given image sensor. Each output path 66 may be coupled to a vertical conductive path that is associated with each column of pixels.

If desired, pixel 100 may be provided with an additional transistor used to implement a dual conversion gain mode. In particular, pixel 100 may be operable in a high conversion gain mode and in a low conversion gain mode. If the additional transistor is disabled, pixel 100 will be placed in a high conversion gain mode. If the additional transistor is enabled, pixel 100 will be placed in a low conversion gain mode. The additional transistor may be coupled to a capacitor. When the additional transistor is turned on, the capacitor may be switched into use to provide floating diffusion FD with additional capacitance. This results in lower conversion gain for pixel 100. When the additional transistor is turned off, the additional loading of the capacitor is removed and the pixel reverts to a relatively higher pixel conversion gain configuration.

Figure 4:
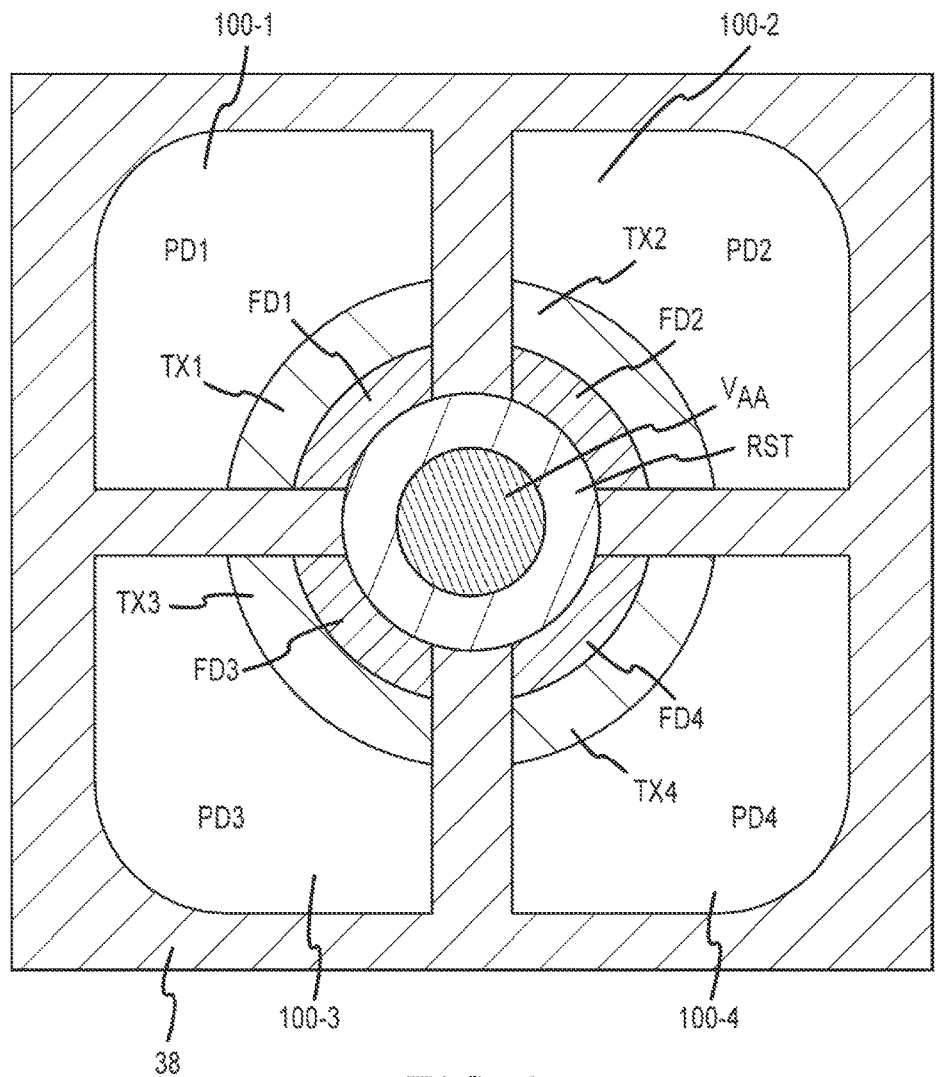
FIG. 4 is a cross-sectional top view of an illustrative group of pixels that share a reset transistor in accordance with an embodiment of the present invention.

In various embodiments, reset transistor 54 may be shared by two, three, four, or more than four pixels. FIG. 4 shows an illustrative group of four pixels that share a single reset transistor. Each pixel may have a respective photodiode, floating diffusion region, and transfer transistor. Pixel 100-1 may include photodiode PD1, transfer transistor TX1, and floating diffusion region FD1. Pixel 100-2 may include photodiode PD2, transfer transistor TX2, and floating diffusion region FD2. Pixel 100-3 may include photodiode PD3, transfer transistor TX3, and floating diffusion region FD3. Pixel 100-4 may include photodiode PD4, transfer transistor TX4, and floating diffusion region FD4.

Photodiodes PD1, PD2, PD3, and PD4 may be formed separately and separated by isolation layer 38. Similarly, transfer transistors TX1, TX2, TX3, and TX4 may be formed separately and separated by isolation layer 38. Floating diffusion regions FD1, FD2, FD3, and FD4 may also be formed separately and separated by isolation layer 38.

Pixels 100-1, 100-2, 100-3, and 100-4 may all share a single reset transistor 54 (RST). The reset transistor may be formed continuously and adjacent to FD1, FD2, FD3, and FD4. Bias voltage supply line Vaa may be formed adjacent to the reset transistor RST. The same bias voltage supply line Vaa may be used for pixels 100-1, 100-2, 100-3, and 100-4.

The arrangement of FIG. 4 allows for effective separation of the transfer transistors and floating diffusion regions without necessitating shallow trench isolation (STI). Shallow trench isolation regions are sometimes used to separate individual pixels from adjacent pixels. However, the presence of STI may introduce higher levels of dark current. By removing the need for STI regions, the arrangement of FIG. 4 significantly reduces the dark current of the pixels.

Figure 5:
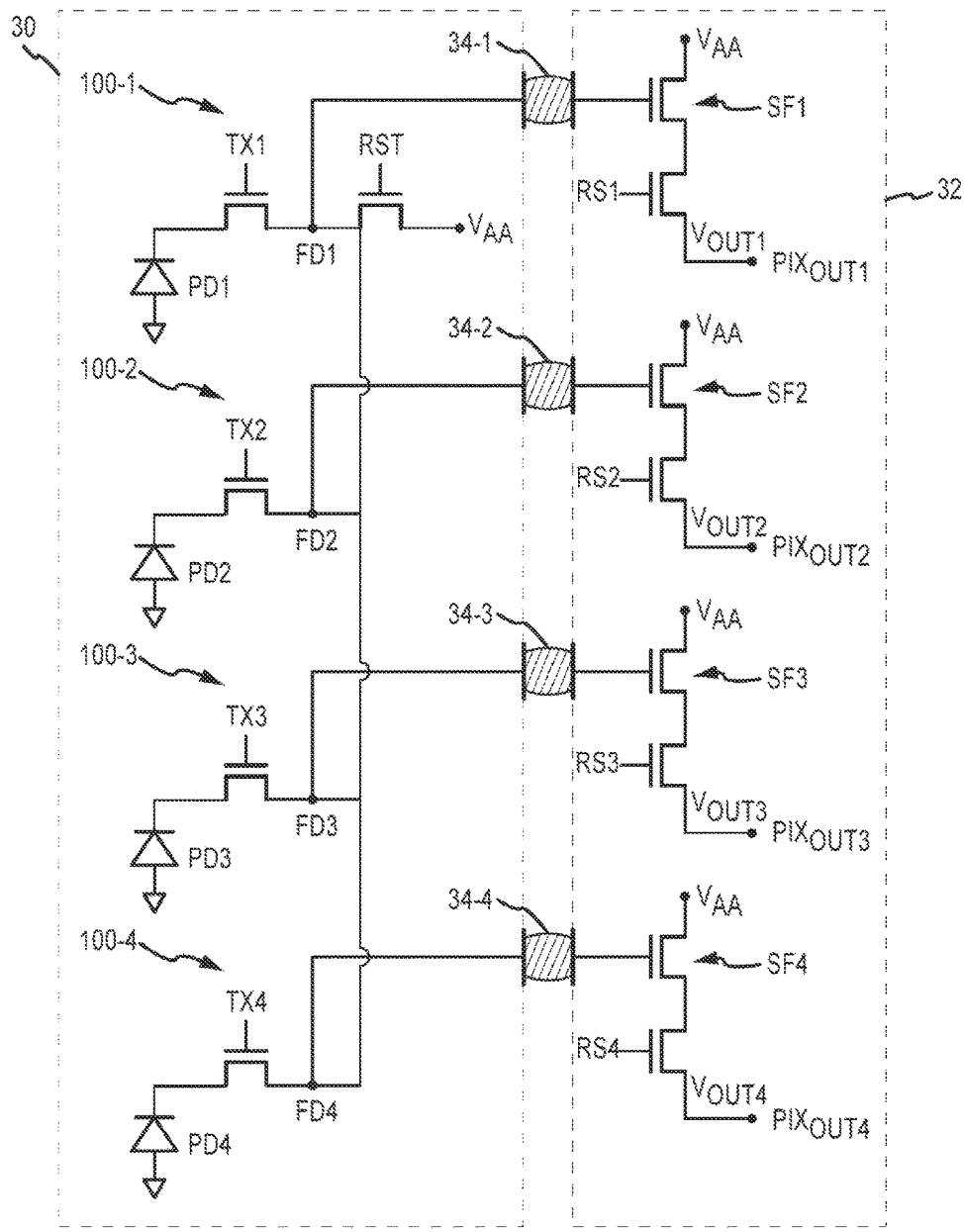
FIG. 5 is a diagram of the illustrative group of pixels of FIG. 4 in accordance with an embodiment of the present invention.

FIG. 5 shows the circuitry of the illustrative group of pixels shown in FIG. 4. Each pixel may have individual source follower transistors (SF1, SF2, SF3, and SF4), row select transistors (RS1, RS2, RS3, and RS4), and outputs ($V_{OUT1}$, $V_{OUT2}$, $V_{OUT3}$, and $V_{OUT4}$). Pixels 100-1, 100-2, 100-3, and 100-4 may each operate in the same way as pixel 100 as described in connection with FIG. 3. However, instead of each pixel having an individual reset transistor, each pixel uses the same reset transistor RST.

Pixels 100-1, 100-2, 100-3, and 100-4 may each have a respective interconnect layer. Interconnect layer 34-1 may be used to connect floating diffusion region FD1 to source follower transistor SF1. Interconnect layer 34-2 may be used to connect floating diffusion region FD2 to source follower transistor SF2. Interconnect layer 34-3 may be used to connect floating diffusion region FD3 to source follower transistor SF3. Interconnect layer 34-4 may be used to connect floating diffusion region FD4 to source follower transistor SF4.

Row select transistor RST of FIG. 4 may be a circular shaped transistor with a circular bias voltage layer Vaa in the center. However, these shapes are merely illustrative and each transistor and region of FIG. 4 may have any desired shape.

Figure 6:
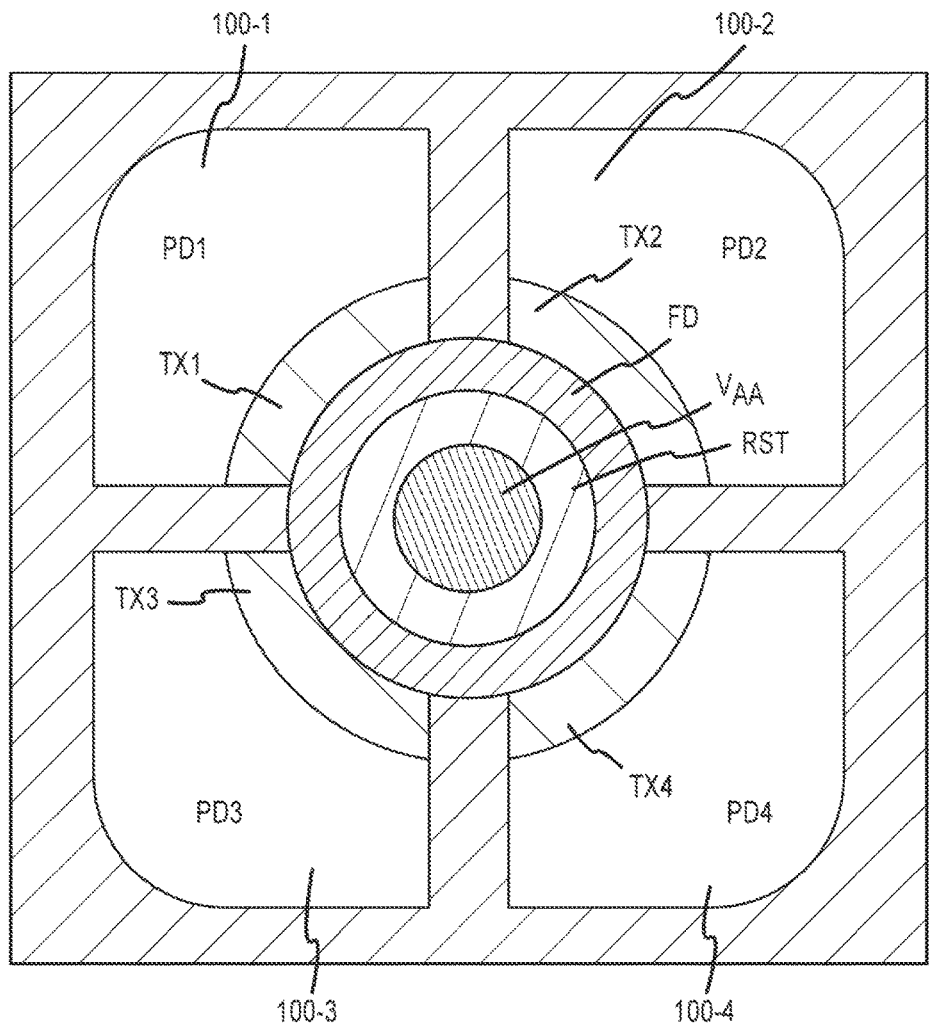
FIG. 6 is a cross-sectional top view of an illustrative group of pixels that share a reset transistor and a floating diffusion region in accordance with an embodiment of the present invention.

In addition to sharing reset transistor 54 among multiple pixels, floating diffusion region 52 may be shared by two, three, four, or more than four pixels. FIG. 6 shows an illustrative group of four pixels that share a single reset transistor and a single floating diffusion region. Each pixel may have a respective photodiode and transfer transistor. Pixel 100-1 may include photodiode PD1 and transfer transistor TX1. Pixel 100-2 may include photodiode PD2 and transfer transistor TX2. Pixel 100-3 may include photodiode PD3 and transfer transistor TX3. Pixel 100-4 may include photodiode PD4 and transfer transistor TX4.

Photodiodes PD1, PD2, PD3, and PD4 may be formed separately and separated by isolation layer 38. Similarly, transfer transistors TX1, TX2, TX3, and TX4 may be formed separately and separated by isolation layer 38.

Pixels 100-1, 100-2, 100-3, and 100-4 may all share a single reset transistor 54 (RST) and a single floating diffusion region (FD). The reset transistor may be formed continuously and adjacent to FD. The floating diffusion region FD may be formed continuously and adjacent to TX1, TX2, TX3, and TX4. Bias voltage supply line Vaa may be formed adjacent to the reset transistor RST. The same bias voltage supply line Vaa may be used for pixels 100-1, 100-2, 100-3, and 100-4.

Similar to the arrangement of FIG. 4, the arrangement of FIG. 6 eliminates the need for shallow trench isolation. This significantly reduces the dark current of the pixels. Additionally, as there is only one floating diffusion region for the group of pixels, only one interconnect layer is needed to connect the floating diffusion region to the source follower transistor. This allows for further reduction of pixel size.

Because each pixel in FIG. 6 uses the same floating diffusion region (FD), the arrangement of FIG. 6 may be particularly useful in applications with binning. For example, the floating diffusion region may be used to store the cumulative charge from photodiodes PD1, PD2, PD3, and PD4 in any combination. For example, the cumulative charge from PD1 and PD4, the cumulative charge from PD2 and PD3, the cumulative charge from PD1, PD2, PD3, and PD4, or the cumulative charge from any other desired combination of the photodiodes may be stored.

Figure 7:
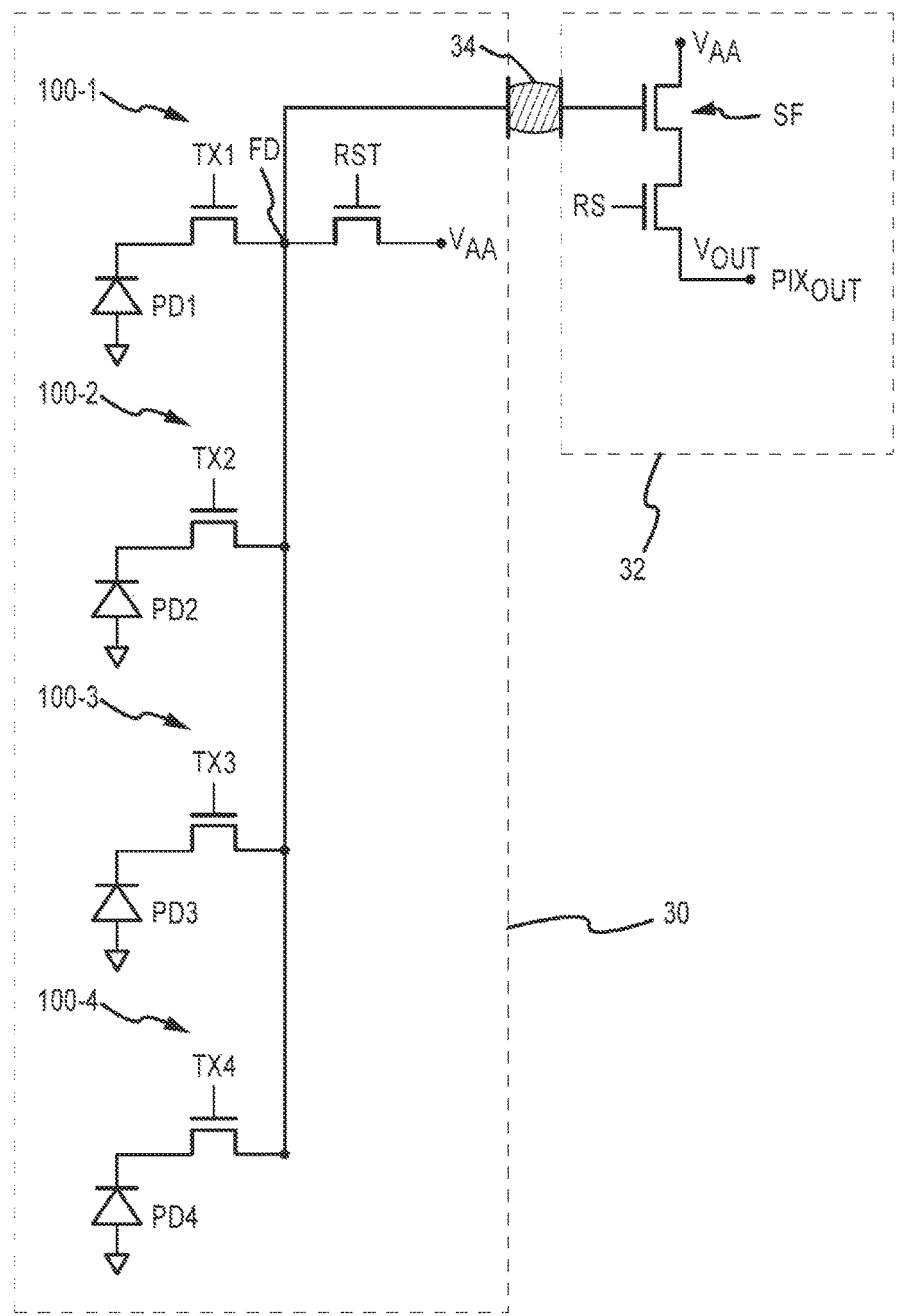
FIG. 7 is a diagram of the illustrative group of pixels of FIG. 6 in accordance with an embodiment of the present invention.

FIG. 7 shows the circuitry of the illustrative group of pixels shown in FIG. 6. Pixels 100-1, 100-2, 100-3, and 100-4 may all use a single source follower transistor (SF), a single row select transistor (RS), and a single output ($V_{OUT}$). Pixels 100-1, 100-2, 100-3, and 100-4 may each operate in the same way as pixel 100 as described in connection with FIG. 3. However, instead of each pixel having an individual reset transistor and floating diffusion region, each pixel uses the same reset transistor RST and the same floating diffusion region (FD).

Pixels 100-1, 100-2, 100-3, and 100-4 may share a single interconnect layer 34. Interconnect layer 34 may be used to connect floating diffusion region FD to source follower transistor SF. Using only one interconnect layer between upper substrate layer 30 and lower substrate layer 32 may help reduce the size of the group of pixels.

Floating diffusion region FD of FIG. 6 may be a circular shaped region with a circular reset transistor and a circular bias voltage layer Vaa in the center. However, these shapes are merely illustrative and each transistor and region of FIG. 6 may have any desired shape.

In certain scenarios, having transfer transistor 50 formed entirely in upper substrate 30 (e.g., FIGS. 2-7) may result in interconnect routing congestion. To provide more space for interconnects corresponding to transfer transistor 50, transfer transistor 50 may span the upper and lower substrate layers.

Figure 8:
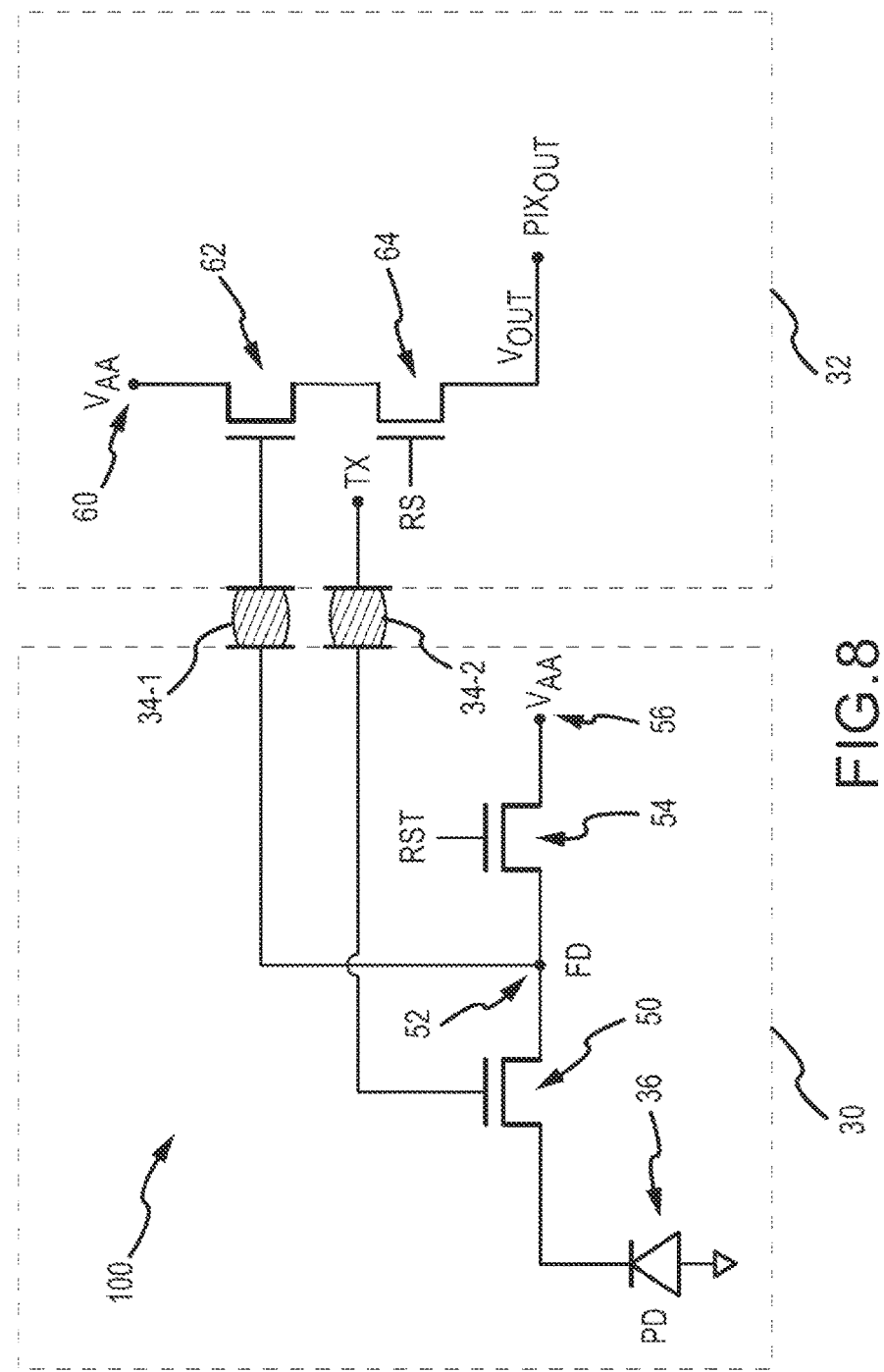
FIG. 8 is a diagram of an illustrative pixel with an interconnect layer to couple a transfer transistor to metal layers in a lower substrate layer in accordance with an embodiment of the present invention.

FIG. 8 shows circuitry for an illustrative pixel where transfer transistor 50 includes metal layers in both upper substrate 30 and lower substrate 32. Pixel 100 in FIG. 8 may have the same operation scheme as pixel 100 in FIG. 3. However, in FIG. 8, in addition to interconnect layer 34-1 that couples floating diffusion region 52 to source follower transistor 62, there is an additional interconnect layer 34-2 that couples transfer transistor 50 to metal layers in lower substrate 32.

An interconnect layer that connects a transfer transistor to metal layers in the lower substrate layer may be used in a variety of pixel architectures. In FIG. 8, reset transistor 54 is shown as being formed in the upper substrate layer 30. However, reset transistor 54 may be formed in lower substrate layer 32. In these embodiments, interconnect layer 34-1 may be coupled to both source follower transistor 62 and the reset transistor. In these embodiments, an additional interconnect layer may connect the transfer transistor to metal layers in lower substrate layer 32.

In various embodiments of the invention, an imaging pixel may be provided with an upper substrate layer, a lower substrate layer, a floating diffusion region in the upper substrate layer, and a photodiode in the upper substrate layer that is coupled to the floating diffusion region. The imaging pixel may also include a source follower transistor in the lower substrate layer and an interconnect layer in between the upper substrate layer and the lower substrate layer. The interconnect layer may couple the floating diffusion region directly to the source follower transistor. The imaging pixel may also include a reset transistor in the upper substrate layer, a transfer transistor in the upper substrate layer, and a row select transistor in the lower substrate layer. The imaging pixel may also include a first metal layer that connects the interconnect layer to the floating diffusion region and a second metal layer that connects the interconnect layer to the source follower transistor. The imaging pixel may include a reset transistor, and the interconnect layer may not be coupled to the reset transistor. The reset transistor may be formed in the upper substrate layer. The interconnect layer may be coupled to only the source follower transistor and the floating diffusion region. The interconnect layer may include metal. The imaging pixel may include a transfer transistor in the upper substrate layer, a metal layer in the lower substrate layer, and an additional interconnect layer that couples the transfer transistor to the metal layer.

In various embodiments of the invention, an imaging pixel may include a first wafer, a second wafer, a floating diffusion region in the first wafer, a photodiode in the first wafer that is coupled to the floating diffusion region, and a reset transistor in the first wafer that is coupled to a bias voltage supply line. The imaging pixel may also include a row select transistor in the second wafer, a source follower transistor in the second wafer, and an interconnect layer in between the first and second wafers that couples the floating diffusion region directly to the source follower transistor. The imaging pixel may also include a transfer transistor in the first wafer, a metal layer in the second wafer, and an additional interconnect layer that couples the transfer transistor to the metal layer.

In various embodiments of the invention, an image sensor may include an upper substrate, a lower substrate, a first photodiode in the upper substrate coupled to a first floating diffusion region, and a second photodiode in the upper substrate coupled to a second floating diffusion region. The image sensor may also include a reset transistor that is coupled to a bias voltage supply line. The reset transistor may be coupled to the first and second floating diffusion regions. The first floating diffusion region, the second floating diffusion region, and the rest transistor may be formed in the upper substrate. The image sensor may also include a first source follower transistor in the lower substrate, a second source follower transistor in the lower substrate, a first interconnect layer that couples the first floating diffusion region directly to the first source follower transistor, and a second interconnect layer that couples the second diffusion region directly to the second source follower transistor. The image sensor may also include first and second row select transistors in the lower substrate.

The foregoing is merely illustrative of the principles of this invention and various modifications can be made by those skilled in the art without departing from the scope and spirit of the invention.

What is claimed is:

1. An imaging pixel comprising:
   an upper substrate layer;
   a lower substrate layer;
   a floating diffusion region in the upper substrate layer;
   a photodiode in the upper substrate layer that is coupled to the floating diffusion region;
   a source follower transistor in the lower substrate layer;
   a first metal layer that is directly coupled to the floating diffusion region, wherein the first metal layer is formed in the upper substrate layer;
   a second metal layer that is directly coupled to the source follower transistor, wherein the second metal layer is formed in the lower substrate layer; and
   an interconnect layer that is interposed between the upper substrate layer and the lower substrate layer, wherein the interconnect layer is directly coupled to the first metal layer in the upper substrate layer and the second metal layer in the lower substrate layer wherein the first metal layer, the interconnect layer, and the second metal layer electrically couple the floating diffusion region directly to the source follower transistor, and wherein the first metal layer, the interconnect layer, and the second metal layer electrically couple the floating diffusion region to the source follower transistor without an intervening additional floating diffusion region.

2. The imaging pixel defined in claim 1, further comprising:
   a reset transistor in the upper substrate layer.

3. The imaging pixel defined in claim 2, further comprising:
   a transfer transistor in the upper substrate layer.

4. The imaging pixel defined in claim 3, further comprising:
   a row select transistor in the lower substrate layer.

5. The imaging pixel defined in claim 1, further comprising:
   a reset transistor, wherein the interconnect layer is not directly coupled to the reset transistor.

6. The imaging pixel defined in claim 5, wherein the reset transistor is formed in the upper substrate layer.

7. The imaging pixel defined in claim 1, further comprising:
   a transfer transistor in the upper substrate layer;
   a metal layer in the lower substrate layer and
   an additional interconnect layer that couples the transfer transistor to the metal layer.

8. The imaging pixel defined in claim 1, wherein the interconnect layer comprises metal.

9. The imaging pixel defined in claim 1, wherein the interconnect layer is positioned such that incoming photons are reflected off of the interconnect layer and towards the photodiode.

10. An imaging pixel comprising:
    a first substrate layer;
    a second substrate layer;
    a floating diffusion region in the first substrate layer;
    a photodiode in the first substrate layer that is coupled to the floating diffusion region;
    a source follower transistor in the second substrate layer that is coupled to the floating diffusion region;
    a bias voltage supply line in the first substrate layer; and
    a reset transistor in the first substrate layer that is coupled between the bias voltage supply line and the floating diffusion region.

11. The imaging pixel defined in claim 10, further comprising:
a row select transistor in the second substrate layer.

12. The imaging pixel defined in claim 11, further comprising:
an interconnect layer in between the first substrate layer and the second substrate layer, wherein the interconnect layer couples the floating diffusion region directly to the source follower transistor.

13. The imaging pixel defined in claim 12, further comprising:
a transfer transistor in the first substrate layer.

14. The imaging pixel defined in claim 13, further comprising:
a metal layer in the second substrate layer; and
an additional interconnect layer that couples the transfer transistor to the metal layer.

15. The imaging pixel defined in claim 10, wherein the first substrate layer is formed above and overlaps the second substrate layer.

16. An imaging pixel comprising:
an upper substrate layer;
a lower substrate layer formed separately from the upper substrate layer, wherein the upper substrate layer overlaps the lower substrate layer;
a floating diffusion region in the upper substrate layer;
a photodiode in the upper substrate layer that is coupled to the floating diffusion region, wherein the photodiode is the only photodiode included in the imaging pixel;
a source follower transistor in the lower substrate layer; and
an interconnect layer interposed between the upper substrate layer and the lower substrate layer, wherein the interconnect layer couples the floating diffusion region directly to the source follower transistor.

17. The imaging pixel defined in claim 16, wherein the interconnect layer is positioned below the upper substrate layer and above the lower substrate layer.

18. The imaging pixel defined in claim 16, further comprising:
a bias voltage supply line in the upper substrate layer; and
a reset transistor in the upper substrate layer that is coupled between the floating diffusion region and the bias voltage supply line.

19. The imaging pixel defined in claim 1, wherein the photodiode is the only photodiode included in the imaging pixel.

* * * * *